United States Patent [19]

Kraft et al.

[11] Patent Number: 4,531,068
[45] Date of Patent: Jul. 23, 1985

[54] BUS LINE PRECHARGING TRISTATE DRIVER CIRCUIT

[75] Inventors: Wayne R. Kraft, Coral Springs; Victor S. Moore, Gainesville; William L. Stahl, Jr., Coral Springs; Nandor G. Thoma, Boca Raton, all of Fla.

[73] Assignee: International Business Machines Corporation, Armonk, N.Y.

[21] Appl. No.: 533,393

[22] Filed: Sep. 19, 1983

[51] Int. Cl.³ ............... H03K 19/094; H03K 19/003
[52] U.S. Cl. .............................. 307/473; 307/443; 307/247 R; 307/270
[58] Field of Search .............. 307/247 R, 270, 443, 307/473, 450; 364/716

[56] References Cited

U.S. PATENT DOCUMENTS 4,096,398  6/1978  Khaitan ........................... 307/270 X
4,449,064  5/1984  Eckert et al. ....................... 307/473

OTHER PUBLICATIONS

Homan, "FET Depletion Load Push-Pull Logical Circuit"; IBM Tech. Discl. Bull.; vol. 18, No. 3, pp. 910, 8/75.
Gaudenzi, "Bidirectional Tristate Driver"; IBM Tech. Discl., Bull.; vol. 20, No. 11A, pp. 4376-4377; 4/1978.
Puri et al., Testing Tristate Off-Chip Drivers in FET Designs"; IBM Tech. Discl. Bull.; vol. 23, No. 8, pp. 3798-3799; 1/1981.

Primary Examiner—Larry N. Anagnos
Attorney, Agent, or Firm—Richard E. Bee

[57] ABSTRACT

A tristate driver circuit is provided on an integrated circuit chip for driving a bus line or signal line located off of the chip. This circuit very rapidly charges the bus line or signal line to positive voltage level each time and just before it switches to its tristate or high impedance output condition. This eliminates the need for a pull-up resistor or pull-up transistor to be connected to the off-chip bus line or signal line.

6 Claims, 1 Drawing Figure

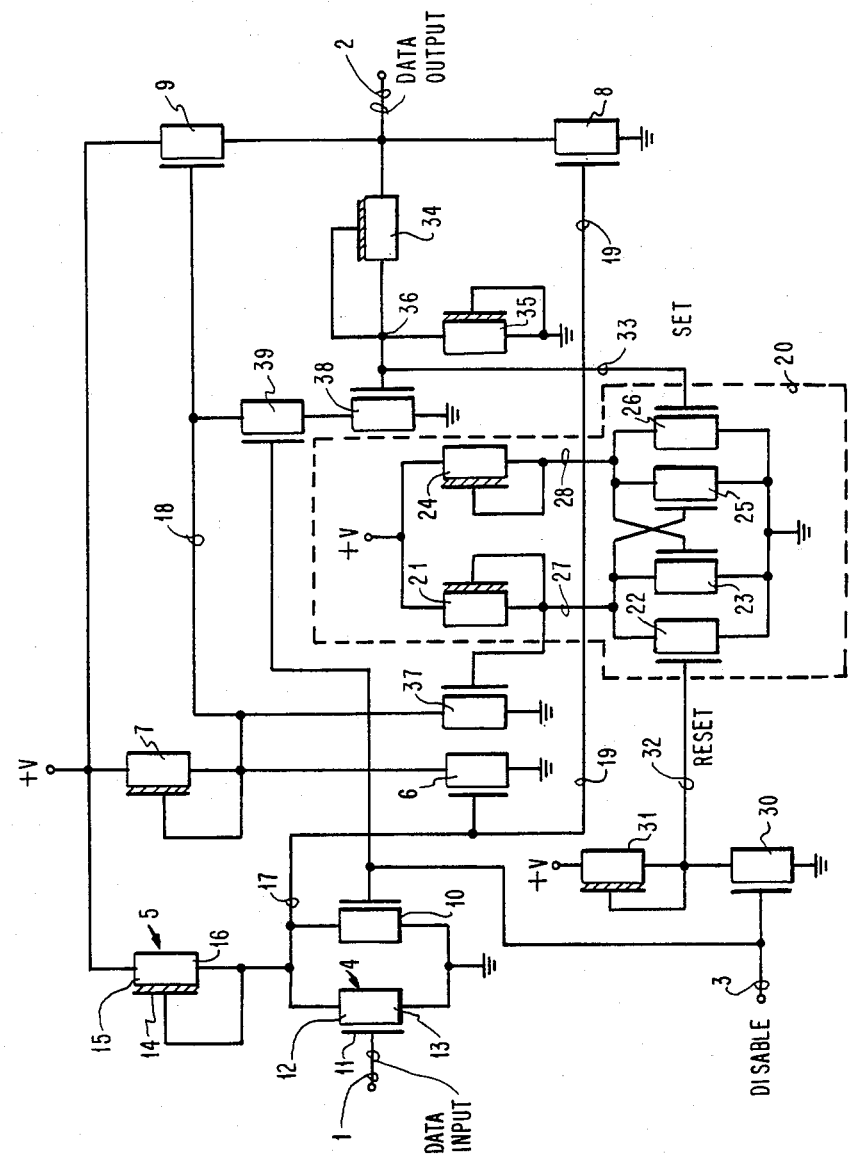

BUS LINE PRECHARGING TRISTATE DRIVER CIRCUIT

DESCRIPTION

1. Technical Field

This invention relates to tristate driver circuits formed on integrated circuit chips.

2. Background Art

Tristate driver circuits are formed on integrated circuit chips for driving bus lines and signal lines located off of the chip. As is known, a tristate driver circuit has a tristate or standby mode wherein it provides a no-signal, high impedance condition at its output terminal. In a typical digital computer or digital data processing application, a goodly number of such driver circuits will be formed on the same integrated circuit chip for purposes of connecting the data processing unit associated with the chip to a multiconductor bus having many bus lines. Typically, several other data processing units will be connected to this same bus. Typically, these other units will also be connected to the bus by means of tristate driver circuits. When a particular unit is not using the bus, it will place its driver circuits in the tristate or high output impedance mode so as not to affect the usage of the bus by another data processing unit.

In some systems, the bus architecture is such that a high voltage level of a few volts on a certain one or ones of the bus lines is used to signify that the bus is free and available for use by any of the units connected to the bus. For sake of a name, such a line will be called a "bus usage control line". It is driven by a tristate driver circuit the same as the other bus lines. Thus, when a particular unit discontinues its use of the bus, it will place in a high impedance output condition its driver circuit which is connected to the bus usage control line. It is then necessary to charge up this bus usage control line to the higher voltage level to tell the other data processing units that the bus is no longer in use.

This has been heretofore accomplished by connecting either a pull-up resistor or a pull-up transistor between the bus usage control line and a positive voltage source. Such a pull-up resistor or transistor will automatically pull up or charge up the bus usage control line when the unit using the bus stops using the bus and puts its driver circuits into the high output impedance mode. This pull-up method using either a resistor or a transistor is, however, very slow acting. For example, for the case of a pull-up resistance of 1000 ohms and a bus line distributed capacitance of 200 picofarads, it will take somewhere on the order of 400 nanoseconds, or longer, to charge the bus usage control line up to the proper value. This represents a substantial waste of time before the next unit can use the bus and is undesirable in many data processing applications.

A similar kind of consideration also applies to any other bus line or signal line which is required to be driven high when its driver circuit is switched to the tristate or high impedance condition.

SUMMARY OF INVENTION

This invention provides an improved tristate driver circuit which quickly and automatically precharges its off-chip bus line or signal line to the desired level just before it switches to its tristate or high impedance output condition. This is accomplished by providing precharge circuitry coupled to the driver circuit and responsive to the tristate control signal for overriding the normal input data signal and causing the driver circuit to commence charging the bus line. There is further provided tristate circuitry coupled to the driver circuit and responsive to its output voltage level for switching the driver circuit to the high impedance output condition when its output voltage and, hence, the bus line voltage reaches the desired predetermined value.

This improved driver circuitry accomplishes the bus charging and tristating action in much less than the 400 nanoseconds previously required. Among other things, it makes use of an output transistor already existing in the driver circuit and having a relatively large current carrying capacity, as required for its normal bus line driving function, to accomplish the precharging action in a very fast manner. This precharging driver circuit eliminates the need for either a pull-up resistor or a pull-up transistor for the off-chip bus line or signal line.

For a better understanding of the present invention, together with other and further advantages and features thereof, reference is made to the following description taken in connection with the accompanying drawing, the scope of the invention being pointed out in the appended claims.

BRIEF DESCRIPTION OF THE DRAWING

The single FIGURE of the drawing is a schematic circuit diagram of a bus line precharging tristate driver circuit constructed in accordance with the present invention.

DESCRIPTION OF THE PREFERRED EMBODIMENT

All of the circuitry shown in the drawing is formed on an integrated circuit chip and is used for purposes of enabling signals to be supplied from another circuit formed on the chip to a bus line or other signal line located off of the chip. The transistors shown in the illustrated embodiment are n-channel metal-oxide-semiconductor (MOS) field-effect transistors (FET's). As such, each transistor includes source, drain and gate electrodes. The gate electrode may sometimes be referred to herein and in the appended claims as the control electrode. The current flow path from the drain electrode to the source electrode within the transistor may sometimes be referred to herein and in the appended claims as the conduction path of the transistor. As is known, the amount of voltage applied to the gate electrode controls the amount of current flow through this conduction path.

In its active or enabled mode, the illustrated driver circuit receives a binary data signal at an input terminal 1 and reproduces such signal at an output terminal 2 with sufficient power to drive an off-chip signal line. Thus, input terminal 1 is connected to some other circuit on the chip and the off-chip bus line or signal line is connected to the output terminal 2. In the present embodiment, the data signal appearing at the output terminal 2 is a non-inverted replica of the data signal supplied to the input terminal 1.

As used herein and in the appended claims, the term "data signal" is used in its broadest sense to mean and include any kind of information conveying signal including, but not limited to, instruction signals, address signals, status signals, control signals, interrupt signals and so forth.

The illustrated driver circuit further includes a control terminal 3 for receiving a control signal from another circuit on the chip for switching the driver circuit to a disabled or standby mode. In this mode, the input data signal at terminal 1 is prevented from reaching the output terminal 2 and, after the precharging action, the output terminal 2 is maintained at a high impedance level with negligible current flowing to or from it. This control signal is referred to herein as a "disable" signal and is represented by a high signal level at the control terminal 3. This disable signal disables the normal operation of the driver circuit and switches it to the standby mode. When the signal level at the control terminal 3 is low, the disabling action is removed and the driver circuit functions in its normal manner to drive the output terminal 2 in accordance with the input signal appearing at the input terminal 1.

The illustrated tristate driver circuit includes driver circuitry responsive to an input binary signal for producing on an off-chip signal line an output binary signal having a value determined by the value of the input binary signal. This driver circuitry takes the form of a push-pull driver circuit which is comprised of transistors 4 through 9. Neglecting for the moment the presence of a further transistor 10, transistor pair 4 and 5 form an inverter circuit. Transistor pair 6 and 7 likewise form an inverter circuit. Transistors 8 and 9 are the power output transistors and are of relatively large size to drive an off-chip bus line or signal line having a substantial amount of loading and inherent capacitance.

Considering first the inverter circuit formed by transistors 4 and 5, transistor 4 is an enhancement mode transistor and has a gate electrode 11, a drain electrode 12 and a source electrode 13. As is known, an enhancement mode transistor is off or non-conductive with zero gate voltage applied. A positive gate voltage greater than the cutoff or threshold value is required to turn it on or render it conductive. Transistor 5, on the other hand, is a depletion mode transistor having a gate electrode 14, a drain electrode 15 and a source electrode 16. As is known, a depletion mode transistor is on or conductive with zero gate voltage applied and a negative gate voltage is required to turn it off.

The foregoing convention regarding drain and source electrodes is used for the other transistors shown in the drawing. In particular, the upper electrode is the drain electrode and the lower electrode is the source electrode.

In the configuration shown, transistor 4 provides the basic inverting action, while transistor 5 provides a pull-up function to pull the inverter output line 17 up to approximately the positive supply voltage value +V when the lower transistor 4 is turned off. The fact that the source electrode 16 of transistor 5 is tied back to its gate electrode 14 means that the gate electrode 14 can never go negative and hence the transistor 5 will always be turned on. In the configuration shown, transistor 5 functions much like a pull-up resistor.

Assuming for the moment that transistor 10 is turned off (low signal level at control terminal 3), when the binary data signal at data input terminal 1 is at a low level (near zero volts), transistor 4 is turned off and transistor 5 pulls the inverter circuit output line 17 up to a high level (a positive voltage of a few volts). Conversely, when the binary input signal at terminal 1 is at a high level, transistor 4 is turned on and pulls the inverter output line 17 down to a low level near zero volts. Thus, the binary signal on inverter output line 17 is an inverted replica of the binary signal at input terminal 1.

The second inverter circuit formed by transistors 6 and 7 functions in a similar manner to produce on its output line 18 an inverted replica of the binary signal supplied to the gate electrode of the lower transistor 6, this binary signal being the signal appearing on the output line 17 of the first inverter circuit. Thus, when the disable signal at control terminal 3 is low, the signal on inverter output line 18 is a non-inverted replica of the signal supplied to the data input terminal 1.

Considering now the normal operation of the driver circuit (control terminal 3 low) and considering first the case where the binary data signal at the data input terminal 1 is at a high level, this high level is inverted by the first inverter 4, 5 to produce a low level on its output line 17. This line 17 is connected by way of a further line 19 to the gate electrode of the lower output transistor 8. This low level on lines 17 and 19 places the output transistor 8 in an off or non-conductive condition. At the same time, the low level on the first inverter output line 17 is inverted by the second inverter 6, 7 to produce a high level on the output line 18 of the second inverter. This line 18 is connected to the gate electrode of the upper output transistor 9 and the high level thereon places the transistor 9 in an on or conductive condition. With lower output transistor 8 off and upper output transistor 9 on, the data output terminal 2 is at a high level. The conductive output transistor 9 supplies the driving current for driving the off-chip signal line connected to the data output terminal 2.

Considering now the opposite case, namely, the case where the input signal at the data input terminal 1 is at a low level, this low level is inverted by the first inverter 4, 5 to supply by way of lines 17 and 19 a high level to the gate electrode of the lower output transistor 8. This places output transistor 8 in the on or conductive condition. At the same time, the high level on line 17 is inverted by the second inverter 6, 7 to place its output line 18 at a low level. This turns off the upper output transistor 9. With the lower output transistor 8 on and the upper output transistor 9 off, the data output terminal 2 is maintained at a low level. In this case, current flow by way of the conductive lower output transistor 8 keeps the off-chip signal line connected to the output terminal 2 in a discharged condition.

As seen from the foregoing, the output signal at data output terminal 2 is a non-inverted replica of the input signal at the data input terminal 1. The output transistors 8 and 9 are of relatively large size (current carrying capacity) so that the off-chip signal line is rapidly charged or discharged, as the case may be, when the input signal at data input terminal 1 changes from one binary level to the other.

Considering now the tristate control action, the illustrated driver circuit further includes precharge circuitry coupled to the push-pull driver circuit and responsive to a control signal at control terminal 3 for overriding the input signal at data input terminal 1 and causing the push-pull driver circuit to commence charging the off chip signal line connected to the data output terminal 2. In the illustrated embodiment, this precharge circuitry includes the enhancement mode transistor 10 which is connected in parallel with the enhancement mode transistor 4 of the first inverter circuit. In this case, the control signal which causes the precharging action is the occurrence of a high signal level at the control terminal 3. This turns on the transistor 10 to pull the inverter output line 17 down to a low level regardless of the value of the data signal on input terminal 1. In this regard, transistors 4, 5 and 10 form a two-input NOR circuit with one input being connected to the data input terminal 1 and the other input being connected to the control terminal 3.

The low signal level which is produced on inverter output line 17 by the presence of the disable signal (high level) at control terminal 3 is supplied by way of line 19 to turn off the lower output transistor 8. At the same time, this low level on inverter output line 17 is inverted by the second inverter 6, 7 to turn on the upper output transistor 9. Output transistor 9 then acts to rapidly charge up or precharge the off-chip signal line connected to the data output terminal 2.

If, of course, the upper output transistor 9 is already on and the off-chip signal line is already charged up at the moment the disable signal appears, then no further charging action is required. The purpose of the precharging circuitry is to ensure that the off-chip signal line is always at a high level immediately following the appearance of the disable signal.

Once the off-chip signal line is precharged to the desired level, the next step is to switch the driver circuit to a tristate or high output impedance mode. This is accomplished by turning off both of the output transistors 8 and 9. To this end, the driver circuit further includes tristate circuitry coupled to the driver circuitry and responsive to its output voltage level for switching the driver circuitry to a high impedance output condition when its output voltage reaches a predetermined level.

This tristate circuitry includes a bistable circuit represented by a set-reset latch 20 which is maintained in a first state ("reset" state) when the control signal (disable signal) is absent at control terminal 3 and which is operative when the control signal (disable signal) is present to switch to a second state ("set" state) when the driver circuitry output voltage at output terminal 2 reaches the desired predetermined level. This set-reset latch 20 includes transistors 21 through 26. When in the reset state, transistors 22 and 23 are conductive and circuit point 27 is at a low level. At the same time, transistors 25 and 26 are nonconductive and circuit point 28 is at a high level. When, on the other hand, the set-reset latch 20 is in a set state, these circuit conditions are reversed. More particularly, transistors 22 and 23 are non-conductive, transistors 25 and 26 are conductive, circuit point 27 is high and circuit point 28 is low.

In the absence of the disable signal at control terminal 3, the set-reset latch 20 is maintained in the reset condition. This is accomplished by means of an inverter circuit which is formed by transistors 30 and 31. More particularly, when the disable signal is absent, the control terminal 3 is at a low level. This low level is inverted to a high level by the inverter circuit 30, 31, which high level is applied to the gate electrode of the latch reset input transistor 22 to keep such transistor turned on. This keeps the circuit point 27 at a low level and keeps the latch 20 from having any effect on the data handling circuit portion of the driver circuit. When the disable signal appears at the control terminal 3, the reset input transistor 22 is turned off. The latch 20, however, remains in its reset condition (because of current flow through transistor 23) until an appropriate signal level at the gate electrode of the set input transistor 26 switches the latch 20 to the set state. Line 33 which is connected to the gate electrode of transistor 26 is the set input for the latch 20.

Depletion mode transistors 34 and 35 are connected to the driver circuit output terminal 2 for purposes of supplying to the latch 20 a voltage level proportional to the voltage level at the output terminal 2. These transistors 34 and 35 function as a voltage divider with the voltage pickoff point 36 being connected to the set input line 33 for the latch 20. During the fabrication of these transistors 34 and 35, the widths of their drain-source conduction paths are dimensioned so as to provide the proper voltage dividing action. In particular, the internal conductances of the transistors 34 and 35 are proportioned so that when the voltage level at the output terminal 2 reaches the desired precharge value, the voltage level on the set input line 33 reaches the appropriate threshold value for turning on the latch set input transistor 26. In this manner, latch 20 is switched to the set state when the output voltage at output terminal 2 reaches the desired predetermined level.

The internal conductances of voltage dividing transistors 34 and 35 are also made sufficiently small so that the tristate mode impedance at the output terminal 2 is still relatively high in spite of their presence and so that these transistors 34 and 35 will not cause any significant discharging of the off-chip signal line when the driver circuit is in the tristate or high output impedance mode.

The latch circuit 20 controls circuitry which is coupled to the driver circuitry for maintaining the high impedance output condition of the driver circuitry when the bistable circuit (latch circuit 20) is in its set state. This circuitry includes a transistor 37 having a drain-source conduction path connected between the driver circuit line 18 and circuit ground and having a gate electrode connected to circuit point 27 in the latch circuit 20. When latch 20 is in the set state, the circuit point 27 is at a high level which, in turn, turns on the transistor 37. Transistor 37, when conductive, keeps the driver circuit line 18 pulled down to a low level. This keeps the upper output transistor 9 turned off so as to maintain the desired high output impedance condition. Latch 20 will remain set and transistor 37 will remain conductive until such time as the disable signal is removed from the control terminal 3. Latch 20 cannot be reset until control terminal 3 goes low to cause the latch reset line 32 to go high to turn on the latch reset input transistor 22.

The latch circuit 20 is somewhat slow acting in responding to the driver circuit output terminal voltage, switching to its set state and turning off the upper output transistor 9. A further improvement in performance is obtained by also providing fast-acting feedback circuitry for rapidly initiating the switching of the driver circuitry to its high impedance output condition when the driver circuit output voltage reaches the desired predetermined level. This fast-acting feedback circuitry is provided by transistors 38 and 39. The upper transistor 39 is primed by the presence of the disable signal at control terminal 3 so as to be ready to conduct when the lower transistor 38 conducts. The lower transistor 38 is controlled by the same voltage divider transistors 34 and 35 which were used for the latch circuit 20. More particularly, when the output voltage at driver circuit output terminal 2 reaches the desired predetermined level, the voltage at the pickoff point 36 is at the turn on threshold value for the feedback transistor 38. Transistor 38 turns on and rapidly discharges the voltage on driver circuit conductor 18 to quickly turn off the upper output transistor 9 to quickly place the driver circuit in the tristate mode.

This feedback circuitry provided by transistors 38 and 39 together with the voltage-dividing transistors 34 and 35 is significantly faster acting than is the feedback path provided by way of the latch 20 and the transistor 37. The latch 20 is nevertheless needed in order to keep the upper output transistor 9 turned off in the event that some other data processing unit connected to the off-chip signal line should try to pull such signal line to a low level. Such an occurrence would turn off the fast feedback transistor 38 which, in the absence of the latch 20, would cause the upper output transistor 9 to be turned on again before such action is desired.

Briefly summarizing the overall operation of the illustrated driver circuit, this driver circuit is a tristate driver circuit which charges the off-chip bus line or signal line connected to its output terminal 2 to a positive voltage level each time and just before it switches to its tristate or high impedance output condition. The signal which tells the driver circuit to switch to the tristate mode is the occurrence of the high level disable signal at control terminal 3. This disable signal overrides the data input signal at terminal 1, turns off the lower output transistor 8 and turns on the upper output transistor 9 to commence the precharging to a positive voltage level of the signal line connected to output terminal 2.

The voltage sensing mechanism coupled to this output terminal 2 and provided by the voltage-dividing transistors 34 and 35, the fast feedback transistor 38 and the set input transistor 26 of the latch 20 monitors the charging of the off chip signal line and when it reaches the desired positive voltage level, this voltage sensing mechanism acts to turn off the upper output transistor 9 and to keep it turned off so long as the high level disable signal is present at the control terminal 3. When the high level disable signal is not present, this voltage sensing and monitoring circuitry is disabled and the driver circuit functions in its normal manner to allow the data input signal at input terminal 1 to drive the off-chip signal line. This disabling of the voltage sensing circuitry is accomplished by turning on the reset input transistor 22 of the latch 20 and by turning off the upper transistor 39 in the fast feedback path.

The use of this off-chip bus line or signal line precharging type driver circuit eliminates the need for a pull-up resistor or pull-up transistor to be connected to the off chip bus line or signal line. The rapid precharging action provided by the present driver circuit reduces the time required for the pull-up action from several hundred nanoseconds to a few tens of nanoseconds. This provides a significant improvement in system response time and is of considerable importance for systems having high speed data processors and high speed input/output devices.

While there has been described what is at present considered to be a preferred embodiment of this invention., it will be obvious to those skilled in the art that various changes and modifications may be made therein without departing from the invention, and it is, therefore, intended to cover all such changes and modifications as fall within the true spirit and scope of the invention.

What is claimed is:

1. A signal line precharging tristate driver circuit formed on an integrated circuit chip for driving a signal line located off of the chip comprising:
    a first input terminal for receiving two-level binary input signals;
    driver circuitry coupled to the first input terminal and having a normal uninhibited operating mode for producing on the signal line two-level binary output signals having values determined by the values of the input signals;
    a second and separate input terminal for receiving a control signal;
    Precharge circuitry coupled to the second input terminal and to the driver circuitry and responsive to a control signal at the second input terminal for overriding the binary input signals and causing the driver circuitry to commence charging the signal line; and
    tristate circuitry coupled to the second input terminal and to the driver circuitry and operative during the occurrence of the control signal for responding to the output voltage level of the driver circuitry for switching the driver circuitry to a high impedance output condition when its output voltage reaches a predetermined level.

2. A tristate driver circuit in accordance with claim 1 wherein the precharge circuitry comprises circuitry coupled to the driver circuitry and responsive to the control signal for forcing the driver circuitry to produce a high level output.

3. A tristate driver circuit in accordance with claim 1 wherein the tristate circuitry includes:
    voltage sensitive circuitry coupled to the output of the driver circuitry and operative during the occurrence of the control signal for forcing the driver circuitry to its high impedance output condition when its output voltage reaches the predetermined level; and
    circuitry responsive to the absence of the control signal for disabling the voltage sensitive circuitry during the normal operation of the driver circuitry.

4. A tristate driver circuit in accordance with claim 1 wherein the tristate circuitry includes:
    a bistable circuit which is maintained in a first state when the control signal is absent and which is operative when the control signal is present to switch to a second state when the driver circuitry output voltage reaches the predetermined level;
    circuitry coupled to the driver circuitry and to the bistable circuit for maintaining the high impedance output condition of the driver circuitry when the bistable circuit is in its second state.

5. A tristate driver circuit in accordance with claim 4 and further including fast-acting circuitry responsive to the control signal and to the output voltage of the driver circuitry for rapidly initiating the switching of the driver circuitry to its high impedance output condition when the control signal is present and when the output voltage reaches the predetermined level.

6. A signal line precharging tristate driver circuit formed on an integrated circuit chip for driving a signal line located off of the chip comprising:
    driver circuitry responsive to an input signal for producing on the signal line an output signal having a value determined by the value of the input signal;
    precharge circuitry coupled to the driver circuitry and responsive to a control signal for overriding the input signal and causing the driver circuitry to commence charging the signal line; and
    tristate circuitry coupled to the driver circuitry and responsive to said control signal and to the output voltage level of the driver circuitry for switching the driver circuitry to a high impedance output condition when its output voltage reaches a predetermined level;

said tristate circuitry including a bistable circuit which is maintained in a first state when the control signal is absent and which is operative when the control signal is present to switch to a second state when the driver circuitry output voltage reaches the predetermined level;

said tristate circuitry also including circuitry coupled to the driver circuitry and to the bistable circuit for maintaining the high impedance output condition of the driver circuitry when the bistable circuit is in its second state; and said tristate circuitry further including fast-acting circuitry responsive to the control signal and to the output voltage of the driver circuitry for rapidly initiating the switching of the driver circuitry to its high impedance output condition when the control signal is present and when the output voltage reaches the predetermined level.

* * * * *